United States Patent [19]
Yoshimitsu et al.

[11] Patent Number: 5,120,384
[45] Date of Patent: Jun. 9, 1992

[54] METHOD OF MANUFACTURING MULTILAYER LAMINATE

[75] Inventors: Tokio Yoshimitsu; Kouji Sato; Yoshihide Sawa, all of Kooriyama, Japan

[73] Assignee: Matsushita Electric Works, Ltd., Japan

[21] Appl. No.: 742,080

[22] Filed: Aug. 7, 1991

Related U.S. Application Data

[63] Continuation of Ser. No. 447,551, Dec. 7, 1989, abandoned.

[30] Foreign Application Priority Data

| May 25, 1989 | [JP] | Japan | 1-131908 |
| Jun. 13, 1989 | [JP] | Japan | 1-151117 |
| Jun. 13, 1989 | [JP] | Japan | 1-151123 |
| Sep. 26, 1989 | [JP] | Japan | 1-250113 |

[51] Int. Cl.⁵ ............................... B32B 31/18
[52] U.S. Cl. .................... 156/242; 156/252; 156/253; 29/825; 29/829; 29/830; 29/852; 174/252
[58] Field of Search ........ 156/242, 252, 253, 245; 29/825, 829, 830, 852; 174/68.5

[56] References Cited

U.S. PATENT DOCUMENTS

| 3,354,542 | 11/1967 | Mallia . | |
| 4,336,100 | 6/1982 | Passlick | 156/252 |
| 4,732,636 | 3/1988 | Varker | 156/252 |
| 4,902,551 | 2/1990 | Nakaso et al. | 156/253 |

FOREIGN PATENT DOCUMENTS

| 6037301 | 10/1976 | Japan | 156/252 |
| 1244849 | 9/1989 | Japan | 156/253 |
| 1244851 | 9/1989 | Japan | 156/253 |
| 1244852 | 9/1989 | Japan | 156/253 |
| 1244853 | 9/1989 | Japan | 156/253 |
| 1244854 | 9/1989 | Japan | 156/253 |
| 1244855 | 9/1989 | Japan | 156/253 |

*Primary Examiner*—Caleb Weston
*Attorney, Agent, or Firm*—Stevens, Davis, Miller & Mosher

[57] ABSTRACT

A method for manufacturing a multilayer laminate provides in metal plates each forming a substrate apertures at positions where through holes are to be formed, fills the apertures with a synthetic resin including a first filler, and prepares prepregs to be disposed on both sides of each substrate by impregnating nonwoven fabric with a thermosetting synthetic resin containing a second filler. The metal plates forming the substrates are thereby allowed to be thicker for realizing larger capacity power supply with an improvement also in heat dissipation characteristics.

15 Claims, 3 Drawing Sheets

METHOD OF MANUFACTURING MULTILAYER LAMINATE

This application is a continuation of application Ser. No. 447,551, filed Dec. 7, 1989, abandoned.

TECHNICAL BACKGROUND OF THE INVENTION

This invention relates to a method for manufacturing a multilayer laminate having therein a metal plate employed as a substrate as well as through holes.

The multilayer laminate manufactured by the method of the kind referred to can be effectively utilized in such electric and electronic devices and equipments as computers and the like in which the heat dissipation characteristics of the laminate are an important requisite.

DESCRIPTION OF THE RELATED ART

In supercomputers or the like where high speed processing of a large volume of data is called for, in general, it has been an overwhelming trend that the heat release value is increased unless a high electric conductivity is provided, as the mounting or wiring density of electronic parts is made higher. Therefore, it has been demanded to provide a multilayer laminate satisfying required high electric conductivity and excellent heat dissipation for printed circuit board in order to improve the devices and equipments in their reliability. Accordingly, there have been suggested various multilayer laminates which employing, in multilayers, metal plates excellent in the electric conductivity as the substrate to attain excellent heat dissipation also by means of heat conductivity of the metal plate.

In, for example, Japanese Patent Application Laid-Open Publication No. 1-29078 of K. Adachi et.al., there is disclosed a multilayer laminate employing metal plates as the substrate, according to which the substrate metal plates are preliminarily provided with apertures at portions corresponding to later forming positions of through holes and having a diameter larger than that of the through hole, a plurality of such metal plates are stacked with prepregs of a thermosetting synthetic resin (of such substrate as glass cloth impregnated with a resin of B stage or similar stage not reaching C stage of complete setting) interposed between them, and the stacked plates with the prepregs interposed are subjected to a hot compression molding, so that the resin component of the prepregs is caused to fill in the apertures in the metal plates to set therein and to set between the respective metal plates, functioning to form insulating resin layers and also to mutually jointly bond the metal plates. As required, interlayer circuit boards may be interposed between the metal plates, and such metal foil as a copper foil or the like is stacked as both the outermost layers. Then the through holes are made in the resin set within the apertures of the respective metal plates, a through-hole metal plating is carried out with respect to peripheral surfaces of the through holes, and a plated metal layer is thereby formed to connect between both the outermost metal foil layers and these layers with, if any, the interlayer circuit boards, while being insulated from the respective metal plates by means of the resin set within the apertures of the metal plates.

With the foregoing arrangement of Adachi et.al., however, there has been involved a problem that, when the through holes are made through the resin set to fill in the apertures of the metal plates, the resin provides just a smooth surface in the peripheral surface of the through holes which is low in anchoring effect, so as to cause the later plated metal layer to rather involve blisters which readily results in peeling off of the plated metal layer, so that the through holes lose their reliability. Further, there remains such a risk that an inherently large difference in the thermal expansion coefficient between the resin filled in the apertures and the metal plates should result in a larger contraction of the resin than that of the metal plates upon cooling after the molding or the like so as to yield in the resin an internal stress which likely to cause the resin to become cracked, the later plated metal layer enters in the thus formed cracks in the resin to reach the metal plates and the insulation between the plated metal layer and manufacture of the metal plates becomes no more longer achievable. This tendency appears remarkable when multilayer laminates for use in computers of the high speed data processing type. That is, a larger capacity power required for the high speed data processing renders heat release value to be higher so that a higher heat dissipation characteristics will be called for, a supply of such larger capacity power with respect to the metal plates utilized as conductors calls for the metal plates to be thicker than 0.15 mm are employed since the thicker the metal plates the lesser the power loss, and the increased thickness of the metal plates is thus desirable to be in a range of about 0.2–3.0 mm eventually results in that the filling amount and the thickness of the resin in the through holes are increased so as to increase the risk of the occurrence of the cracks due to the internal stress increased by the increased resin thickness.

As the method of the kind referred to for manufacturing the multilayer laminate, there may also be enumerated the one disclosed in Japanese Patent Publication No. 56-37720 by T. Okeguchi et.al., assigned to the same assignee as in the present case, but this method of Okeguchi et.al. also involves substantially the same problem as has been referred to in respect of the method of Adachi et.al.

FIELD OF TECHNOLOGY

A primary object of the present invention is, therefore, to provide a method for manufacturing a multilayer laminate with a plurality of stacked thicker metal plates high in the ability to pass electricity, and showing excellent heat dissipation.

Another object of the present invention is to provide a method for manufacturing a multilayer laminate excellent in the reliability in respect of through holes, with effective reduction in the occurrence of peeling, blistering or cracking in the plated metal layer of the through holes.

Still another object of the present invention is to provide a method for manufacturing a multilayer laminate which allows a large capacity power supply to be achieved with excellent heat dissipation characteristics when employed in the high speed data processing equipment and devices, in particular in supercomputers.

Other objects and advantages of the present invention shall be made clear in the following explanation of the present invention detailed with reference to an embodiment disclosed shown in accompanying drawings.

Figure 1:
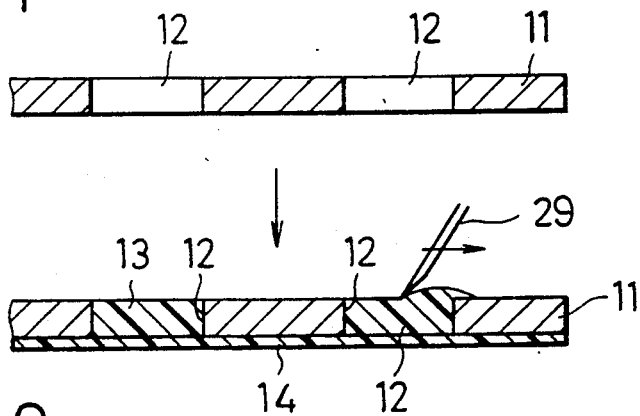
FIGS. 1-5 are fragmentary sectioned views in respective manufacturing steps of a multilayer laminate according to the present invention.

While the present invention shall now be described with reference to the embodiment shown in the drawings, it should be appreciated that the intention is not to limit the invention only to the embodiment shown but rather to include all alterations, modifications and equivalent arrangements possible within the scope of appended claims.

DISCLOSURE OF PREFERRED EMBODIMENT

Referring to FIG. 1, a relatively thick metal plate is employed as the substrate in the method for manufacturing a multilayer laminate, according to the present invention. In this substrate 11, apertures 12 are made at corresponding positions to those where later described through holes are to be formed, and in a diameter larger than that of the through holes, and a synthetic resin 13 containing a filler is filled in these apertures 12. Prepregs 14 are disposed for holding between adjacent ones of them each of a plurality of the substrates 11, while the prepregs 14 are prepared by impregnating a nonwoven cloth forming a base with a thermosetting resin which contain a filler.

More specifically, for the metal plate forming the substrate, a plate of copper, aluminum, iron, nickel, zinc or the like may be used, while preferable is one excellent in electric conductivity and thermal conductivity, and a copper plate, for example, may effectively be employed. In the event where a copper plate is employed as the substrate, it is likely that normally smoothly flat, mirror finished surface of the copper plate renders the adhesion of the synthetic resin forming the prepreg 14 with respect to the copper plate to be insufficient so that interfacial peel-off may easily take place between the copper plate and the resin of the prepreg 14 due to heat imposed upon drilling for making the through holes, wiring work with soldering or the like. Accordingly, it is desirable to provide the surface of the copper plate to be rough so that the adhesion between the copper plate surface and the prepreg can be improved, and an oxidizing treatment or electrolytic plating may be employed for roughening the copper surface.

The oxidizing treatment of the copper plate is to be carried out by treating the copper plate surface with an alkaline aqueous solution containing an oxidizing agent, for which agent such chlorate as sodium chlorite NaClO$_2$ or the like, potassium persulfate K$_2$S$_2$O$_8$ and the like may be mainly used. By the treatment of the copper plate with the alkaline aqueous solution containing the oxidizing agent, such a reaction as $$Cu \rightarrow Cu(OH)_2 \qquad (I)$$

takes place first by an action of alkali, and then a further reaction as $$Cu(OH)_2 \rightarrow CuO + H_2O \qquad (II)$$

will be made to take place by an action of the oxidizing agent, so that a coat of copper oxide will be produced on the copper plate surface, while it is considered more likely that such a reaction as follows is occurring:

$$2Cu + NaClO_2 + 2H_2O \rightarrow 2Cu(OH)_2 + NaCl$$
$$Cu(OH)_2 \rightarrow CuO + H_2O \qquad (III)$$

The roughening of the copper plate surface can be realized by producing in this way the copper oxide coat on the copper plate surface. In an event where only cupric oxide CuO is produced by the oxidation, the coat is provided in black color so that the oxidation is regarded as a blackening treatment or black oxide treatment, while the coat consisting not only of the cupric oxide CuO but also of cuprous oxide Cu$_2$O which a brown color so that the oxidation is regarded as a browning treatment or as a brown oxide treatment. An observation of these copper plates a electron micrograph of a magnification X20,000 shows that the blackened copper plate surface is in a crystal structure of long needle-like oxide, whereas the browned copper plate surface is in a crystal structure of fine particle oxide. In this case, the long needle-like crystal formed by the blackening treatment is easily degradable and may cause no trouble so long as the blackened copper plate is used in an epoxy resin multilayer laminate. When the laminate is used in a polyimide resin multilayer laminate where the laminate is subjected to a high temperature at stacking and molding steps, it is preferable that the copper plate is subjected to the browning treatment for the surface roughening.

The above blackening and browning treatments are identical from a viewpoint that the copper plate surface is oxidized by means of the oxidizer contained in the alkali solution, but they are distinctive from each other in such treating conditions as treating concentration, temperature, time and the like, while the treating conditions set gradual will result in general in the browning treatment. For the alkaline aqueous solution for the oxidation, such a three component solution of sodium chlorite NaClO$_2$, sodium hydroxide NaOH and sodium phosphate Na$_3$PO$_4$ is generally used, and the blackening treatment is to be made with such a concentration range of the respective components as 30-90g/1 for NaClO$_2$, 10-20g/1 for NaOH and 5-15g/1 for Na$_3$PO$_4$, preferably, under such treating conditions of solution temperature and treating time as 60°-95° C. and 2-5 minutes, preferably. In achieving the browning treatment, it is preferable that the concentration of the respective components is set in such range as 30-150g/1 for NaClO$_2$, 5-20g/1 for NaOH and 2-10g/1 for Na$_3$PO$_4$, at treating temperature set in a range of 420 -80° C. for a treating time in a range of about 2-10 minutes. For the browning treatment, further, such other mixture treating solution than the above three component solution as a four component solution of NaClO$_2$ 175g/1, NaOH 20g/1, Na$_2$CO$_3$ 16.5g/1 and Na$_3$PO$_4$ 4.7g/1 at 65° C. for 4 minutes, or a three component solution of NaClO$_2$ 135g/1, NaOH 15.6g/1 and NaNO$_3$ 11.8g/1 at 75° C. for 5 minutes.

Further, the oxide coat of the blackened copper plate surface is generally deteriorated in haloing resistance characteristic, but the oxide coat of the browned copper plate surface is excellent in haloing resistance characteristic. Here, the metallic copper is lower in the chemical affinity than hydrogen and does not form directly any hydroxide or metallic salt but, in the state of cupric oxide, it reacts with hydrochloric acid or sulfuric acid to dissolve, forming a metallic salt. Therefore, cupric oxide in the oxide coat on the copper plate that is exposed at the peripheral surface of the through holes and caused to dissolve in hydrochloric acid or sulfuric acid contained in the plating solution during plating treatment, for example, with respect to the through holes, and there arises a dissolving erosion due to acid entering from such dissolved portion of the coat at the peripheral surface of the through holes into the copper plate. Such portion where the dissolving erosion has taken place looks white as if it is a halo, and this phenomenon is regarded as a haloing. When such haloing takes place, it is no longer possible to ensure electric insulation between the peripheral surface of the through holes and the copper plate, so that the reliability of the through holes will be decreased. In order to prevent the haloing from occurring, it will be sufficient to carry out a reduction treatment with respect to the copper plate already subjected to the oxidation of its surface as has been referred to, so as to reduce cupric oxide readily dissolvable to acid into cuprous oxide hardly dissolvable to acid. For the reduction agent, formaldehyde, hypophosphorous acid compound, hydrazine compound, sodium boron hybride, borazane compound, borazene compound, amine borane compound, nascent hydrogen produced upon dissolution of metallic zinc or the like may be employed.

For the electrolytic plating treatment of the copper plate, further, an electrolytic bath of acidic copper, for example, may be employed, and the surface of the copper plate can be roughened with powdery copper deposited on the copper plate surface upon application of an electric current to the copper plate as a cathode within the electrolytic bath. Main components of the electrolytic bath may be copper sulfate and sulfuric acid. In depositing the powdery copper on the copper plate surface, however, it is necessary to apply an electric current at a density higher than a limit current density of the electrolytic bath, which results in an abrupt decomposition of hydrogen on the cathode so as not to allow the powdery copper to deposit on the copper plate and thus the copper plate cannot be roughened by the powdery copper. For this reason, the electrolytic bath is used with an addition of such water-soluble nitrate as sodium nitrate, potassium nitrate, ammonium nitrate, copper nitrate, nitric acid or the like. When the nitrate is added, nitric ions are reduced to be ammonium ions so that the decomposed hydrogen at the cathode will be thereby taken so as to prevent any hydrogen bubble from being formed on the copper plate of the cathode, whereby the powdery copper having a high degree of adhesion can be deposited on the copper plate surface. When the copper plate surface is thus roughened by means of the electrolytic plating in this way, the state of the roughened surface is not affected by an action of high temperature. Therefore, it will be appreciated that the foregoing oxidizing treatment is effective in the event where such a high temperature that may damage the roughened surface is required to be used. Further, while plated metal deposited on the copper plate surface is not required to be particularly limited, copper is the optimum.

The relatively thick metal plate forming the substrate 11 requires no limitation in the concrete, but the plate showing excellent electric conductivity and thermal conductivity as well is the one more than 0.15 mm thick and is practically required to be in a range of 0.2-3.0 mm.

In the prepregs 14 interposed between a plurality of the metal plate substrates 11 upon their stacking, the nonwoven fabric employed as the basic material should preferably be of glass fiber, taking into account electric characteristics or heat-resisting properties. In this case, the nonwoven fabric is prepared in the same manner as in manufacturing papers so as to have a coarse structure, allowing thus the substrate to be impregnated with a sufficient amount of the thermosetting resin and such resin to be effectively retained in the fabric. When a comparison is made here between the nonwoven glass fabric and a woven glass fabric, a prepreg comprising the woven glass fabric as the basic material is dense in the glass fiber so as to restrict impregnatable resin amount to be less in a range of only 50-60 wt. %, whereas the amount in the case of the nonwoven glass fabric reaches to be more than 90 wt. %. In the case when the prepreg of the woven glass fabric is employed, it is highly possible that a risk arises in a flowing of the resin impregnated in the woven glass fabric into through-hole-making apertures made in the metal plate substrate upon the stacking and heat molding of the substrates and prepregs, and in a drawing of the woven glass fabric toward the apertures with the flow of the resin into the apertures even to an extent of eventually contacting the metal plate substrate. When the impregnated resin amount in the prepregs is so small that the resin cannot be interposed between the metal plate substrates and the woven glass fabric at the apertures to cause them directly contact with each other, the applied heat and mechanical force to the directly contacting metal plates and glass fabric cause a whitening which is so-called measling at such contacting portion. In the case of the prepreg 14 which employs the nonwoven glass fabric, a sufficient amount of the resin is contained in the nonwoven glass fabric so that, even when the nonwoven glass fabric is pulled toward the apertures 12 in the substrate 11 with the foregoing flow of the resin and reaches the position of contacting with the metal plate, the large resin content allows the resin to be interposed between them to prevent them from directly contacting each other. Accordingly, such whitening as the measling can be prevented from occurring.

In the case when the woven glass fabric is employed, further, the woven fabric comprises bunches of fibers woven into the fabric so that the resin impregnation becomes insufficient, the fiber shows a remarkable tendency of lowering the adherence with respect to the resin particularly at bundled portions of the fiber, the interfacial peeling off is caused to occur between the fiber and the resin upon application of external stress for making the through holes after the stacking and heat-molding, and the plating solution enters into such portion of the interfacial peel-off upon the through hole plating to render the plated metal layer to be readily uneven in the thickness. When the nonwoven glass fabric is employed as in the present invention, on the other hand, the nonwoven fabric having no bundled fiber allows the resin to sufficiently infiltrate into the fabric with a remarkably elevated adherence between the fibers and the resin to render the interfacial peel-off between them hardly to take place, any entrance of the plating solution between the fibers and the resin can be restrained upon the through hole plating, and any short-circuiting can be effectively prevented from occurring.

Figure 6:
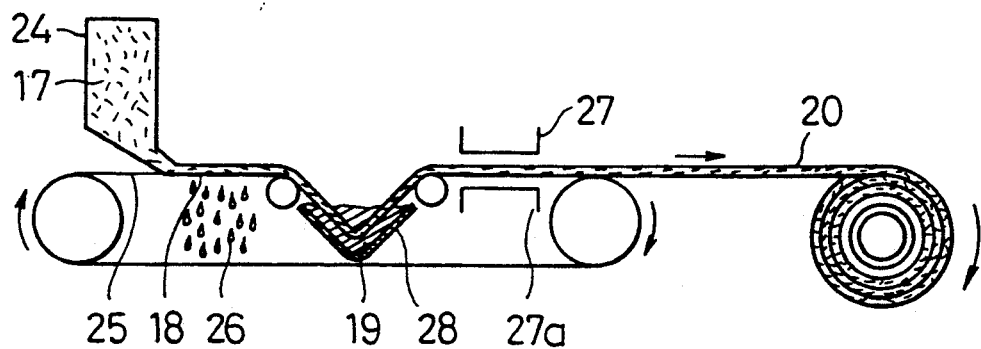
FIG. 6 is a schematic diagram for explaining steps for manufacturing a glass fabric forming a base of prepregs employed in the manufacturing method of FIGS. 1-5.

The nonwoven glass fabric employed as the basic material of the prepreg 14 can be prepared preferably through such manufacturing steps as shown in FIG. 6. That is, glass fibers 17 are integrated into a mat 18, which mat is dipped in a binder solution 19 to be impregnated therewith, the thus impregnated mat is dried and a nonwoven glass fabric 20 is thereby manufactured. For the glass fibers 17, here, short fibers into which rovings or the like are cut may be effectively employed. For example, the glass fibers 17 are $10-13\mu$ in diameter and several mm to several ten mm in the length, particularly in a range of 10-20 mm, preferably. The glass fibers 17 are first mixed with water, a coupling agent or a surface-active agent, and are then supplied from a tank 24 onto a wire mesh belt 25 so as to be in the mat 18 of a fixed thickness, water content 26 is removed from the mat with a vacuuming carried out from lower side of the wire mesh belt 25, and thereby the dried mat 18 into which the glass fibers 17 are integrated is obtained. This mat 18 is then led into a dipping vessel 28 to be dipped into the solution 19 therein together with the belt 25. The binder solution 19 is prepared by dissolving such a binder as an acrylic resin or an epoxy resin in a solvent with a coupling agent of a silane compound mixed as required. For the solvent, methyl ethyl ketone, methyl Cellosolve, toluene, alcohol and the like may be employed, and the binder solution 19 is made to be of a concentration optionally set in accordance with an amount of the binder to be contained in the nonwoven glass fabric 20. As the mat 18 of the glass fibers 17 is dipped in the binder solution 19 to filtrate the solution 19 into the mat 18, further driving of the wire mesh belt 25 causes the mat 18 to pass between vertically opposing heaters 27 and 27a to be heated and dried, the solvent of the binder solution 19 is evaporated, and the nonwoven glass fabric 20 (called also as glass paper) into which the glass fibers 17 are bound and integrated by the binder can be thus obtained. It is preferable that the nonwoven glass fabric 20 is formed to be of a weight of about $40-100g/m^2$.

While the binder can be deposited uniformly over the entirety of the nonwoven glass fabric 20 by having the mat 18 of the glass fibers 17 dipped in the binder solution 19 to have the mat 18 impregnated with the solution 19, it is preferable here that the impregnation amount of the binder solution 19 is adjusted to that solid component content of the binder to be contained in the nonwoven glass fabric 20 will be less than 15 wt. % of a total amount of the glass fibers and binder. In an event where the prepregs are prepared with the nonwoven glass fabric 20 employed as the basic material, it is optimum that the impregnated resin adheres to respective surface of the glass fibers 17 through a coupling agent, but the binder is necessarily contained in the nonwoven glass fabric 20. This binder is interposed between the nonwoven glass fabric 20 and the impregnated resin therein so as to show a tendency that the adherence of the resin to the nonwoven glass fabric 20 is lowered, but it has been found that the adhesion between the nonwoven glass fabric 20 and the impregnated resin can be well maintained with the binder content set to be about 15 wt. %, in particular, less than 12 wt. %, so long as the entrance of the plating material is well restrained. When the binder content is excessively smaller, integrating strength of the glass fibers 17 is deteriorated so as to render the nonwoven glass fabric 20 to be easily shorn, and the lower limit of the binder content should preferably be set at about 5 wt. %. In this case, there has been such problem that the adhesion between the glass fibers and the impregnated resin has been deteriorated when, instead of the dipping of the mat 18 into the binder solution 19, the binder is applied by means of a spraying over the surface of the mat 18, as has been known, due to that the binder is kept in a state where the binder takes a form of a film spread over the surface of the nonwoven glass fabric. According to the present invention in which the mat 18 is dipped in the binder solution 19, this problem can be solved.

For the thermosetting resin for the impregnation in the nonwoven glass fabric and the preparation of the prepreg 14, such various resins as epoxy resin, polyimide resin, unsaturated polyester resin and the like may be employed, but preferable is to use, taking into account the electric characteristics, epoxy resin, polyimide resin or a modified resin of them. Since in the multilayer laminate, further, a high temperature treatment is carried out upon the circuit formation or soldering operation, the thermosetting resin for forming the prepreg 14 should preferably be the one which is 170° C. in the glass transition temperature and, in particular, excellent in the heat-resistance of more than 180° C. When the glass transition temperature of the resin is below 150° C., there arises a risk that, when the laminate is subjected, for example, to a soldering treatment with a soldering bath of 260° C. for about 30 seconds, the plated metal layer in the through holes may be peeled off due to a thermal shock. Further, the resin should preferably be prepared to be of a melting viscosity in a unit of poise (P) of 70-2,000P or, more specifically, 100-1,000P in a half-set state and under 130° C. It has been found that, in an event where the melting viscosity becomes less than 70P, the impregnated resin is caused to flow too much upon the stacking and heat-molding of the substrates 11 and prepregs 14 so that the multilayer laminate will readily fluctuate in the plate thickness and, when the melting viscosity exceeds 2,000P, the flow of the resin becomes too poor, reversely, so that the laminate after the molding may still be contain improper voids.

Referring next to manufacturing steps of the method according to the present invention, the respective substrates 11 comprising a metal plate in which many apertures 12 are formed and are filled with a resin 13, as shown in FIG. 1. While the resin 13 is not required to be specifically limited, it is preferable to use the same sort of epoxy, polyimide or their modified resin as the impregnating resin to the nonwoven glass fabric, in the B stage. In filling the apertures 12 with the resin 13, a filler is mixed in the resin 13, and the filler that may be employed will be $Al_2O_3$, $Al_2O_3 \cdot H_2O$, silica, talc, MgO, $CaCO_3$, $Sb_2O_3$, $Sb_2O_5$, E glass, spherical powder or glass fiber of D, T, R, Q or the like glass, needle-like powder of alamide fiber of KEVLAR by Du Pont or of one by Teijin, and the like, which are employable respectively alone or in a combination of two or more of them. When the spherical powder is employed as the filler, the powder should preferably be of a center diameter of more than 15 $\mu$m. When the center diameter is less than 15 $\mu$m, cracks are likely to occur in the resin 13 filling the apertures 12 so as to render adhesion effect for the later described plated metal layer in the through holes to be insufficient. When the needle-shape powder is used as the filler, preferable to use is the one having a center diameter of more than 10 $\mu$m and more than twice as long as the diameter, since any one of less than 10 $\mu$m in the center diameter and less than twice as long as the diameter is likely to cause cracks to occur so as to render the adhesion effect insufficient with respect to the plated metal layer in the through holes. The center diameter denotes, by the way, the peak value in a distribution of diameter of respective particles forming the filler, that is, the highest number of the diameter for the particles of the filler.

By blending the filler at a blending amount in a range of about 10–1,000PHR with the resin 13, crack occurrence can be reduced, and there can be attained an effect of improving the adhesion of the plated metal layer 16 in the through holes, but the blending is so made that the thermal expansion coefficient after the setting of the resin 13 containing the filler will be in a difference less than 20ppm/0° C. from the thermal expansion coefficient of the substrate 11. That is, it is preferable to set the thermal expansion coefficient $\alpha_R$ of the resin 13 including the filler and the thermal expansion coefficient $\alpha_M$ of the substrate 11 by properly adjusting the type or blending amount of the filler to be blended with the resin 13 for satisfying an equation $$\alpha_M - 20\text{ppm}/°C. \leq \alpha_R \leq \alpha_M + 20\text{ppm}/°C.$$

In filling the apertures 12 with the resin 13 containing the filler, the resin may be prepared in such liquid state as a varnish or the like or in a powdery state for flowing it into the apertures, while the one prepared in the powdery state is preferable in view of workability. When the resin in the powdery state is employed, the powder should preferably be of the center diameter in a range of 100–350 μm. The filler may be blended after the resin 13 is crashed to be of this grain size, or the resin 13 and filler are preliminarily blended to be in the varnish state and, after being heated to remove the solvent and to be semi-set, crashed into the powder of the particular grain size, so that the resin 13 will be employed in the state of powder containing the filler. When, in this case, the center diameter or grain size of the resin 13 is less than 100 μm, the resin becomes larger in re-cohesion property to be likely to become clods, and there arises a risk that the resin is deteriorated in filling ability, while, in an event where the center diameter of the powdery resin 13 exceeds 350 μm, the powder particle becomes too large to achieve a dense filling in the apertures 12 so as to cause also the risk of deteriorating the filling ability to arise.

In filling the apertures 12 of the substrate 12 with the resin 13 in the powdery state with the filler contained, the prepreg 14 is first disposed at a lower surface of the substrate 11 to close the bottom of the apertures 12, the powdery resin 13 is poured into the apertures 12, excessive powder is removed by means of a squeegee 29 slid along upper surface of the substrate 11, and the apertures 12 can be uniformly filled with the resin 13.

Figure 2:
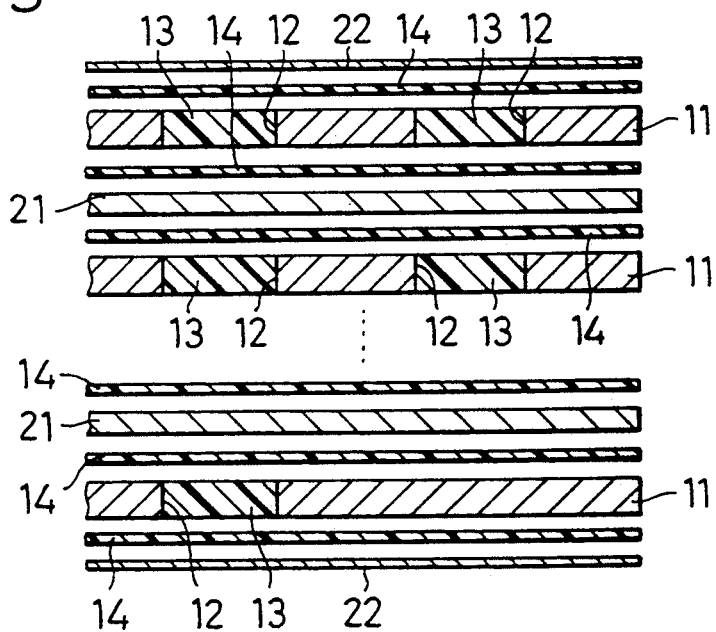
Figure 3:
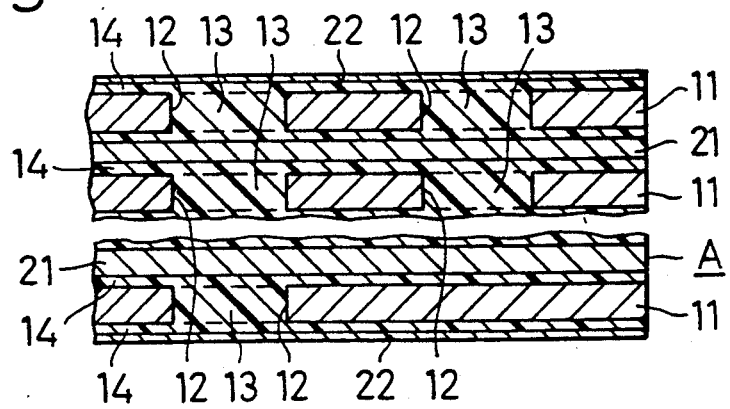

A plurality of sets of the substrate 11 and prepreg 14 with the apertures 12 thus filled with the powdery resin 13 are then stacked as shown in FIG. 2, interposing between them such inner layer circuit board or boards 21 with further prepregs 14 disposed between the upper surface of the respective substrate 11 and lower surface of the circuit board 21, as required, such metal foils 22 as copper foils are placed on the outermost substrates 11 through the prepreg 14 on the lowermost side and with further prepreg 14 interposed on the topmost side, also as required, and thus obtained stack is compression-molded under a heat, whereby the thermosetting resin of the prepregs 14 is made to set and, as shown in FIG. 3, a multilayer laminate A in which the substrates 11 and inner layer circuit boards 21 are alternately stacked with the metal foils 22 adhered to the outermost prepregs 14 can be obtained. During this heat-compression molding, the resin 13 filled in the apertures 12 of the respective substrates 11 is melted and set in the apertures, while any loss in the volume of the resin 13 due to loss of gaps between respective powder particles of the resin by the compression can be compensated for by a relatively small amount of the resin flowing out of the prepregs 14. Accordingly, it is prevented from occurring that the filling of the apertures 12 with the resin becomes insufficient as in any known laminate where the apertures or through holes are to be filled only with flowing resin out of the prepregs. Since the substrates 11 of the metal plate and the resin 13 containing the filler are made to involve the smaller difference in the thermal expansion coefficient than 20ppm/°C., further, any unevenness in the surface flatness of the multilayer laminate A can be held to a minimum, and the laminate can be manufactured in relatively flat state, whereby the metal foils 22 on the top and bottom surfaces of the multilayer laminate A can be provided to be flat and practically less attention can be given to an accurate application of etching resist or the like for forming circuit patterns by means of an etching carried out with respect to the metal foils 22.

With the blending of the filler with the resin 13, any contraction of the resin 13 filling the apertures 12 upon cooling of the molded laminate A can be restrained so that any difference in the contraction of the resin 13 from that of the substrates 11 can be made smaller, and the resin 13 set can be prevented from involving any crack due to the difference in the contraction with respect to the metal plate substrates 11, while the filler contained in the resin 13 is also contributive to the crack prevention. When the filler is mixed also in the thermosetting resin of the prepregs 14 which is to flow into the apertures 12 of the substrates 11, there arises no substantial fluctuation in the concentration of the filler between the resin 13 in the apertures 12 and the resin flowing out of the prepregs 14 into the apertures 12, and the crack prevention can be further improved. For the filler to be mixed in the resin forming the prepregs 14, the same items as referred to for the filler mixed in the resin 13 can be employed. If the spherical powder filler is used, the one of the center diameter less than 20 μm is preferable while the needle-shape powder of a center diameter less than 15 μm and less than twice as long as the diameter is preferable. In an event where the spherical powder is of the center diameter over 20 μm or the needle-shape powder is of the center diameter over 15 μm and more than twice as long as the diameter, the filler particles cannot be carried by the resin flow out of the prepregs 14 into the apertures 12, and the filler of the resin in the apertures 12 may become partly nonuniform. Blending amount of the filler into the thermosetting resin forming the prepregs 14 should preferably be in a range of 30–150PHR, since a risk may arise in insufficient achievement of the function of the filler when the blending amount is less than 30PHR or in insufficient infiltration of the resin into the nonwoven glass fabric when the blending amount exceeds 150PHR due to excessively larger viscosity. When, on the other hand, the blending amount is in the range of 30–150PHR, the glass fibers of the nonwoven fabric forming the basic material of the substrate are coarse enough for allowing the thermosetting resin to sufficiently infiltrate between the respective fibers.

Figure 4:
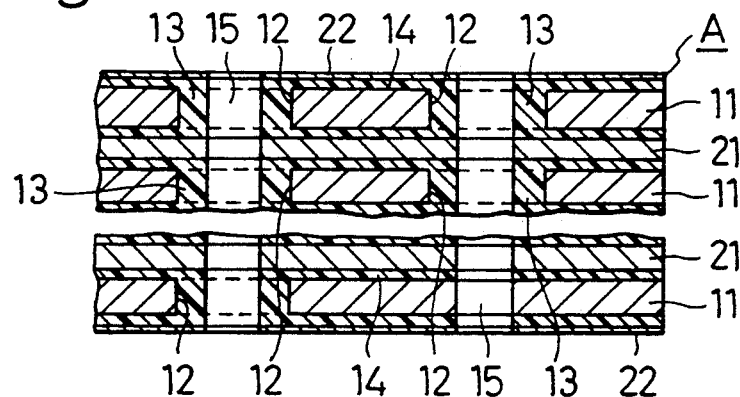

The multilayer laminate A of FIG. 3 formed as has been referred to is then subjected to a perforation for forming through holes 15 as shown in FIG. 4, by means of a drilling or the like. The through holes 15 are made with a smaller diameter than that of the apertures 12 of the metal-plate substrates 11, so that peripheral surface of the through holes 15 will be formed as spaced by a certain distance from the peripheral surface of the apertures 12 of the substrates 11, the peripheral wall of the through holes 15 being formed by the set layer of the resin 13 containing the filler and having a thickness corresponding to the spacing distance between the both peripheral surfaces of the apertures 12 and the through holes 15, the layer showing an electric insulation. Further, one of the substrates 11 is made to have a lesser number of apertures 12 so that one of the through holes 15 will be made directly through the particular substrate (shown at the lowest position in FIG. 4), and a power source or ground can be directly connected to this substrate 11.

Figure 5:
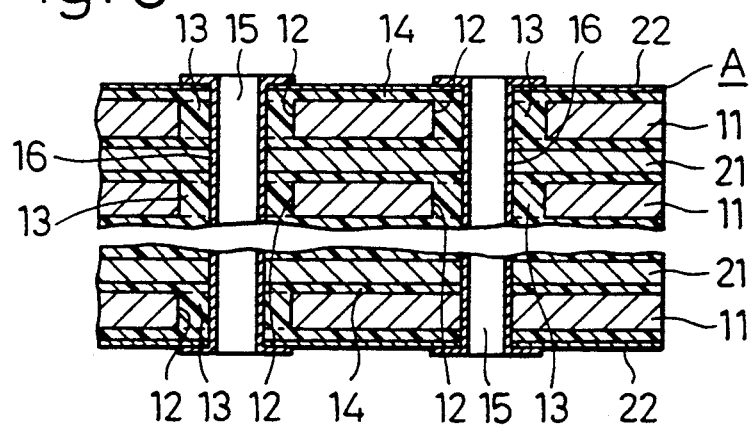

As shown in FIG. 5, next, a plated through-hole metal layer 16 is formed by means of a copper plating or the like on the peripheral surface of the through holes 15 made as in the above, upon which an outer layer circuit of a desired circuit pattern is simultaneously formed, as required, with respect to the metal foils 22 on the outermost layered prepregs 14 by means of an etching process or the like. In forming the through-hole metal layer 16, many of fine particles of the filler contained in the set resin layer forming the peripheral wall of the through holes 15 are exposed to provide finely small undulation functioning to provide an anchoring action, whereby the adhesion of the plated metal layer 16 with respect to the peripheral surface of the through holes 15 can be remarkably improved, and any possibility of peeling off of the plated metal layer 16 can be effectively reduced. The particles of the filler exposed are only embedded in the resin layer and will not be contributive substantially to an infiltration of plating solution and the like.

Now, the present invention shall be detailed with reference to Examples in the following.

EXAMPLES

I. Metal Plate i. Surface Treatment of Metal Plate #1—Oxidation (Blackening)

Copper plates respectively of 500×400×0.5 mm were employed, in which plate apertures of a diameter 1.5 mm were made at a pitch of 1.8 mm to be 100 pieces in column direction and 60 pieces in line direction. Thus perforated copper plates were preliminarily treated by dipping them in a copper chloride solution at 25° C. for 25 seconds, the solution having been prepared by mixing 2.4 kg of cupric chloride ($CuCl_2.2H_2O$) and 18 lit. of industrial hydrochloric acid (35 wt. %) into water of 42 lit., the plates were thereafter rinsed, dipping them for 60 seconds in a hydrochloric acid solution prepared by mixing 70 lit. of the industrial hydrochloric acid (35 wt. %) with water of 155 lit., and rinsing them again. The copper plates were then dipped for 2 minutes in a blackening treatment solution of 95° C., the solution having been prepared in a composition of 31g/1 of sodium chlorite, 15g/1 of sodium hydroxide and 12g/1 of sodium phosphate, and the copper plates were thus blackened. The copper plates were further linsed and dried at 120° C. for 60 minutes. The thus treated copper plates presented black colored surfaces.

ii. Surface Treatment of Metal Plate #2—Oxidation (Browning)

The same copper plates as the foregoing copper plate alkali-cleaning them with L alkali cleaner of ELECTRO.BRITE #402 by Ebara Densan for 4 minutes at a liquid temperature of 70° C., thereafter rinsing them, acid-cleaning them with an acid cleaner of ELECTRO.BRITE #4A also of Ebara Densan under conditions of 2.5 minutes and liquid temperature of 67° C., thereafter rinsing them, carrying out a soft etching for 1.5 minutes at a liquid temperature of 51° C. with KOBLAR-H of ELECTRO.BRITE #499-B by Ebara Densan, thereafter rinsing them, and treating them for 1 minute at normal temperatures. Then, the thus treated copper plates were dipped for 2 minutes in a browning treatment solution of 80° C., the solution having been prepared in a composition of 95g/1 of sodium chlorite, 6.5g/1 of sodium hydroxide and 2.0g/1 of sodium phosphate to have them browned. The thus browning-treated copper plates presented brown colored surfaces.

iii. Surface Treatment of Metal Plate #3—Oxidation/Reduction

The same copper plates as the foregoing copper plate #1 were employed, which were treated in the same manner to be oxidized to be blackened, thereafter reduced by dipping them for 20 minutes in an aqueous solution of hypophosphorous acid adjusted to be of pH 5, linsed and dried.

iv. Surface Treatment of Metal Plate #4—Electrolytic Plating

Acidic electrolytic bath was prepared in a composition of 50g/1 of $CuSO_4$, 100g/1 of $H_2SO_4$ and 15g/1 of $HNO_3$ at a bath temperature of 25° C., the same copper plates as in the foregoing copper plates #1 were dipped as the cathode in this electrolytic bath, and an electrolytic plating was carried out for 5 minutes with an applied current density of $7A/cm^2$.

II. Basic Material i. Preparation of Nonwoven Glass Fabric #11

A binder solution was prepared by dissolving epoxy-novolak resin as a binder and aminosilane as coupling agent in a mixture solvent of methyl-ethyl-ketone and toluene. An integrated mat of glass fibers of the center diameter 13 $\mu$m and 15 mm long was formed with such apparatus as in FIG. 6 for the binder dipping, and was dipped in the above binder solution in the apparatus, the dipped mat was then dried, and a nonwoven glass fabric of a binder (solid component) content of 12 wt. % was obtained. This fabric weighed $60g/m^2$.

ii. Preparation of Nonwoven Glass Fabric #12

Except for a modification of the binder content to 15 wt. %, the same steps as in the above nonwoven glass fabric #11 were carried out and a nonwoven glass fabric was obtained also through the binder dipping. This fabric weighed $60g/m^2$.

iii. Preparation of Nonwoven Glass Fabric #13

Except for a modification of the binder content to 18 wt. %, the same steps as in the above nonwoven glass fabric #11 were carried out and a nonwoven glass fabric was obtained also through the binder dipping. This fabric weighed 60g/m².

iv. Preparation of Nonwoven Glass Fabric #14

A glass fiber mat was prepared through the same steps as in the case of the above nonwoven glass fabric #11, the binder solution used in preparing the fabric #11 was applied uniformly onto this mat by means of a spraying means, the mat was dried, and a nonwoven glass fabric of a binder (solid component) content of 12 wt. % was obtained. This fabric weighed 60g/m².

III. Prepreg Resin i. Preparation of Resin #21

A polyfunctional epoxy resin composition was prepared by mixing a polyfunctional epoxy resin (QUATREX5010 by Dow Chemical: resin component 75 wt. %, MEK 25 wt. %), with respect to 100 parts by weight of its resin component, 0.2 parts by weight of 2-ethyl-4-methyl imidazole. Glass transition temperature of this resin composition in set state was measured by TMA, to be 170° C.

ii. Preparation of Resin #22

An epoxy resin composition was prepared by mixing 85 parts by weight of bisphenol A type epoxy resin, 15 parts by weight of phenolic novolak type epoxy resin and 1 part by weight of dicyandiamide with 1 equivalent weight of benzyldimethylamine. Glass transition temperature of this resin composition in set state was measured to be 140° C.

IV. Prepreg i. Preparation of Prepreg #31

Epoxy resin varnish of the above resin #21 or #22 was blended with each of such fillers #41-#45 to the prepreg as later shown TABLE I in such composition as in later shown TABLE II, and they were uniformly mixed. As the filler, either one of spherical and needle-shape E glass powder was used. Nonwoven glass fabrics #11-#14 as the basic material of the prepreg were dipped in these resin varnishes to be impregnated therewith, and were heated at 150° C. for 5 minutes to be dried, and prepregs of a resin content 01 wt. % were prepared. Melting viscosity at 130° C. of the resin contained in the prepregs was measured to be 600P.

ii. Preparation of Prepreg #32

Except for modified setting of the drying conditions to be 150° C. and 2 minutes, the same steps as those for the prepreg #31 were carried out and prepregs were obtained, and the melting viscosity at 130° C. of the resin contained in these prepregs was measured to be 40P.

iii. Preparation of Prepreg #33

Except for modified setting of the drying conditions to be 150° C. and 3 minutes, the same steps as those for the prepreg #31 were carried out and prepregs were obtained, and the melting viscosity at 130° C. of the resin contained in the prepregs was measured to be 70P.

iv. Preparation of Prepreg #34

Except for modified setting of the drying conditions to be 150° C. and 7 minutes, the same steps as those for the prepreg #31 were carried out and prepregs were obtained, and the melting viscosity at 130° C. of the resin contained in the prepregs was measured to be 2,000P.

v. Preparation of Prepreg #35

Except for modified setting of the drying conditions to be 150° C. and 8 minutes, the same steps as those for the prepreg #31 were carried out and prepregs were obtained, and the melting viscosity at 130° C. of the resin contained in the prepregs was measured to be 3,000P.

V. Aperture Filling Resin i. Preparation of Filling Resin #51

The same varnishes as those used in preparing the foregoing prepregs were blended with such aperture fillers #61-#64 as in the later shown TABLE I at a loading of 400PHR, in such compositions as in the later shown TABLE II, and they were uniformly mixed. For the filler, the spherical and needle-shape E glass powder was employed. The solvent was removed by heating at 150° C. for 5 minutes to solidify the resin, which was then crashed, and the aperture filling resins with the filler contained were prepared. Thermal expansion coefficient of the filler containing resin as set was measured to be 24ppm/°C. Since the thermal expansion coefficient of the copper plate is 17ppm/°C., the resin shows a difference of 7ppm/°C. in the thermal expansion coefficient from the copper plate. Adjusting the crashing grain size, the filling resins of the center diameter of 300 $\mu$m, 60 $\mu$m, 100 $\mu$m and 500 $\mu$m, respectively, were prepared.

ii. Preparation of Filling Resin #52

Except for modified setting of the load of the filler blended in the resin varnish to be 180PHR, the filling resins were obtained in the same manner as in the above for the filling resins #51. The obtained resins measured a thermal expansion coefficient of 37ppm/° C., so that the difference in the thermal expansion coefficient from the copper plate was 20ppm/°C. Adjusting the crashing grain size, the filling resins of the center diameter of 300 $\mu$m, 60 $\mu$m, 100 $\mu$m and 500 $\mu$m, respectively, were prepared.

iii. Preparation of Filling Resin #53

Except for modified setting of the load of the filler blended in the resin varnish to be 120PHR, the filling resins were obtained in the same manner as in the above for the filling resins #51. The thus obtained resins measured a thermal expansion coefficient of 42ppm/°C., so that the difference in the thermal expansion coefficient from the copper plate was 25ppm/°C. Adjusting the crashing grain size, the filling resins of the center diameter of 300 $\mu$m, 60 $\mu$m, 100 $\mu$m and 500 $\mu$m, respectively, were prepared.

Concrete examples of the present invention shall be detailed in the followings:

EXAMPLE 1

The foregoing metal plate #1 as the substrate, fabric #11 as the base material of the prepreg, resin #21 as the one for the prepreg, prepreg #31 of this fabric impregnated with this resin, such filler #41 as shown in TABLE I for the prepreg, resin #51 as the aperture filling resin, and such filler #61 as shown in TABLE I as the filler to the aperture filling resin were respectively employed, while adjusting the thermal expansion coefficient of the substrate #1 and filling resin #51 to show a difference of 7ppm/°C., and making the grain size of the filling resin #51 to be 300 μm. The aperture filling resin was poured into the apertures 12 in the respective substrates 11 placed on each of the prepregs 14, as shown in FIG. 1, with any excessive resin removed by means of the squeegee. Three of such substrates, and two of the inner layer circuit boards having circuit pattern formed by etching-processing the copper foils of both-surface copper clad epoxy resin plate were stacked, and two of the copper foil of 35 μm thick were placed respectively to be each of the uppermost and lowermost layers of the stack with an additional one of the above prepreg interposed between the uppermost copper foil and the substrate. The stack was then subjected to the heat compression molding, under a compressing condition of 20kg/cm² maintained, as heated at 140° C. for 20 minutes and, further, at 170° C. for 90 minutes, and as cooled down for 20 minutes required. Through holes were made by drilling work at positions of the apertures in the substrates, a plated through-hole metal layer was provided onto the peripheral surface of the respective through holes, and the multilayer laminate was obtained.

EXAMPLES 2-29

The substrate, base material for the prepreg, resin for the prepreg, prepreg, filler to the prepreg, aperture filling resin and filler to the filling resin were employed in such selected combinations as show in TABLE II, respectively, and various multilayer laminates having the through holes with the peripheral metal layer plated were obtained through the same steps as in the above EXAMPLE 1.

COMPARATIVE EXAMPLE 1

Metal plates not surface-roughened were employed as the substrates. Instead of the nonwoven glass fabric, a woven glass fabric was used as the base material of the prepreg, a resin varnish of the foregoing prepreg resin #21 but without blending any filler was used to impregnate the woven glass fabric therewith, the impregnated fabric was heated at 150° C. for 5 minutes to be dried, and prepregs of a resin content of 55 wt. % were thus obtained. Except for these difference in the substrate and prepreg, the same steps as in the above EXAMPLES were carried out, and a multilayer laminate having the through holes with the peripheral metal layer plated was obtained.

The respective multilayer laminates obtained through the foregoing EXAMPLES 1-29 and COMPARATIVE EXAMPLE 1 were subjected to tests in respect of the adhesion of the plated through-hole metal layer, presence or absence of any crack in the peripheral resin layer in the through holes, presence or absence of the measling, presence or absence of undulation in the surface of the laminate, presence or absence of any infiltration of plating solution in the through holes, adhesion between the substrate and the prepreg, fluctuation in plate thickness at various parts of the laminate, moldability, presence or absence of any offset of the filler in the aperture filling resin within the apertures, and filling or packing ability of the aperture filling resin.

In testing the adhesion of the plated through-hole metal layer, the multilayer laminates were respectively cut into samples of 50×50 mm dimensions, the samples were floated for 60 seconds in a solder bath of 260° C., and the number of the through holes involving any peeling or blister in the plated through-hole metal layer among total 50 pieces of the through holes in each sample was counted. The presence or absence of any crack in the peripheral resin layer in the through holes was carried out by counting the number of the through holes involving any crack in the peripheral resin layer among total 50 pieces of the through holes in the laminates before being provided with the plated through-hole metal layer. The presence or absence of the measling was determined by counting the number of any measling occurred. In measuring the undulation in the surface of the laminate, the depth of concavities in the surface of the copper foil on the multilayer laminates before being subjected to the through-hole drilling was measured by means of a needle-contacting type surface roughness meter (SURFCOM 550A a in trade mark by Tokyo Seimitsu) and the largest value for all of the concavities was taken. The presence or absence of the infiltration of the plating solution was determined by counting the number of the through holes involving microscopically ovservable infiltration into the prepreg portions within the through holes sectioned for the observation among 50 pieces of the through holes. The test of the adhesion between the substrates and the prepreg resin was carried out by taking 10 sheets of samples cut out of the multilayer laminates in the dimension of 50×50 mm, dipping these samples for 1 minute in a solder bath at 260° C., and determining if the peeling or blister took place between the substrates and the prepreg resin.

Figure 7:
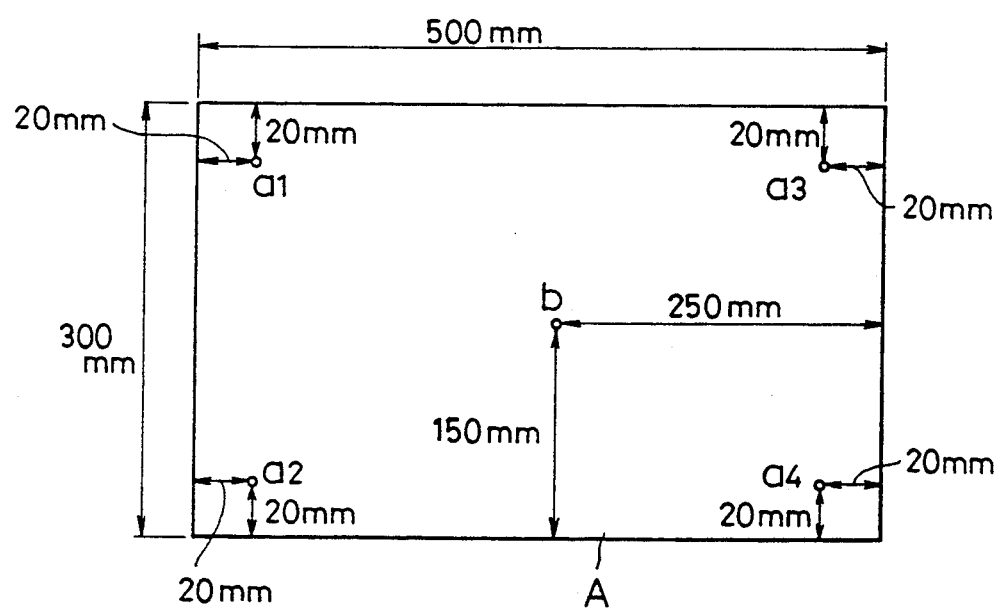
FIG. 7 is an explanatory view for a measuring process for fluctuation in the plate thickness in the multilayer laminate.

The test of the fluctuation in plate thickness within the multilayer laminate was carried out by measuring the plate thickness at respective points a1-a4 and b in the laminate formed in a dimension of 500×300 mm, as shown in FIG. 7, and performing a calculation:

b thick.-{(al thick.+a2 thick.+a3 thick.+a4 thick.)/4} The moldability was carried out through a visual observation for any void occurring in the prepreg exposed by removing the copper foil on the surface of the laminate. The offset of the filler contained in the filling resin of the apertures was measured through visual observation for 10 sectioned through holes to see if the filler was in offset state or uniformly dispersed within the apertures. The fillability of the filling resin into the apertures was measured by visually observing from top side of the apertures, upon filling the apertures with the powdery resin including the filler by means of the squeegee, if any clod occurred or not due to recoherence of the powdery resin containing the filler and if any gap took place within the apertures.

Respective results of the above measurement were as shown in corresponding columns in the following TABLE II, in which "Adhesion of Through Hole Plating", "Crack", "Plating Infiltration", "Adhesion Between Substrate and Prepreg" and "Offset in Filler to Aperture" were represented in fractions with the sample number as the denominator and with the counted number as the numerator. Further, "Meelzing" is shown in the number of occurrence, "Surface Uneven" is shown by the depth of the concavities, and "Fluctuation in Plate Thickness" is given in a calculated value for points involving the fluctuation. For "Moldability" and "Fillability of Aperture Filling Resin" are denoted by "G" for good one and "N" for not good one.

As will be clear from TABLE II, the multilayer laminate according to the present invention is improved in every respect of the foregoing characteristics as compared with the multilayer laminate according to COMPARATIVE EXAMPLE, and, in particular, it has been found that the multilayer laminate according to the present invention has been remarkably improved in respect of the "Adhesion of Through Hole Plating", "Crack" and "measling" which have been the problems involved in the known multilayer laminate.

TABLE I

|  |  | No. 1 | No. 2 | No. 3 | No. 4 | No. 5 |
|---|---|---|---|---|---|---|
| Substrate: | Treatment | Blackening | Browning | Oxidiz./Reduct. | Electrol. Plat'g | None |
| Basic Mat.: | Type | Nonwoven Fab. | Nonwoven Fab. | Nonwoven Fab. | Nonwoven Fab. | Woven Fab. |
|  | Process | Dipping | Dipping | Dipping | Spraying | — |
|  | Binder Amt. | 12% | 15% | 18% | 12% | — |
| Resin: Tg |  | 170° C. | 140° C. | — | — | — |
| Prepreg Melting Viscosity (Poise) |  | 600 | 40 | 70 | 2,000 | 3,000 |
| Filler to Prepreg: (Spherical) | Dim. φ (μm)x1 | 20 | 20 | 20 | 20 | 30 |
|  | Comp. | 80 PHR | 10 PHR | 30 PHR | 150 PHR | 80 PHR |
| Filler to Prepreg: (Needle-Shape) | Dim. φ (μm)x2 | 15 × 25 | 15 × 25 | 15 × 25 | 15 × 25 | 20 × 45 |
|  | Comp. | 80 PHR | 10 PHR | 30 PHR | 150 PHR | 80 PHR |
| Difference in Therm. Exp. Coeff. between Substrate & Apert. Filling Resin (ppm/°C.) |  | 7 | 20 | 25 | — | — |
| Filler to Apert. Filling Resin: | Shape x3 | Needle | Spherical | Needle | Spherical | — |
|  | Dim. (μm)x4 | 10 × 25 | 15 | 7 × 15 | 10 | — |
| Grain Size of Apert. Filling Resin, (μm) |  | 300 | 60 | 100 | 500 |  |

Notes:
No. 1 employs #1, 11, 21, 31, 41, 51, and 61: No. 2 employs #2, 12, 22, 32, 42, 52 and 62: No. 3 employs #3, 13, 33, 43, 53 and 63: No. 4 employs #4, 14, 34, 44, and 64: and No. 5 employs #35. x1 is center diameter of E-glass spherical powder: x2 is center diameter × center length of E-glass needle-shape powder: x3 is of E-glass powder: and x4 is center diameter × center length for needle-shape, and center diameter for spherical shape.

TABLE IIA

| | EX. 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Condition: | | | | | | | | | | | | | | | | |
| Substrate | #1 | #2 | #3 | #4 | #1 | #1 | #1 | #1 | #1 | #1 | #1 | #1 | #1 | #1 | #1 | #1 |
| Basic Mat. | #11 | #11 | #11 | #11 | #12 | #13 | #14 | #11 | #11 | #11 | #11 | #11 | #11 | #11 | #11 | #11 |
| Resin | #21 | #21 | #21 | #21 | #21 | #21 | #21 | #22 | #21 | #21 | #21 | #21 | #21 | #21 | #21 | #21 |
| Prepreg Melting Viscos. (Poise) | 600 | 600 | 600 | 600 | 600 | 600 | 600 | 600 | 40 | 70 | 2,000 | 3,000 | 600 | 600 | 600 | 600 |
| Filler to Perpreg (Spher.) | #41 | #41 | #41 | #41 | #41 | #41 | #41 | #41 | #41 | #41 | #41 | #41 | #42 | #43 | #44 | #45 |
| Filler to Prepreg (Needle) | — | — | — | — | — | — | — | — | — | — | — | — | — | — | — | — |
| Therm. Exp. Coeff. Diff. Bet. Subst. & Apert. Fill. Resin (ppm/°C.) | 7 | 7 | 7 | 7 | 7 | 7 | 7 | 7 | 7 | 7 | 7 | 7 | 7 | 7 | 7 | 7 |
| Filler to Apert. Fill. Resin | #61 | #61 | #61 | #61 | #61 | #61 | #61 | #61 | #61 | #61 | #61 | #61 | #61 | #61 | #61 | #61 |
| Grain Size of Apert. Fill. Resin (μm) | 300 | 300 | 300 | 300 | 300 | 300 | 300 | 300 | 300 | 300 | 300 | 300 | 300 | 300 | 300 | 300 |
| Measurement: | | | | | | | | | | | | | | | | |
| Adh. of Thru. Hole Plat'g | 0/50 | 0/50 | 0/50 | 0/50 | 0/50 | 0/50 | 0/50 | 35/50 | 0/50 | 10/50 | 10/50 | 10/50 | 10/50 | 0/50 | 0/50 | 15/50 |
| Crack | 0/50 | 0/50 | 0/50 | 0/50 | 0/50 | 0/50 | 0/50 | 0/50 | 0/50 | 0/50 | 0/50 | 0/50 | 30/50 | 0/50 | 0/50 | 22/50 |
| Meezling | 0 | 0 | 0 | 0 | 0 | 0 | 0 | 0 | 0 | 0 | 0 | 0 | 0 | 0 | 0 | 0 |
| Surf. Uneven (μm) | 12 | 12 | 12 | 12 | 12 | 12 | 12 | 12 | 12 | 12 | 12 | 12 | 23 | 12 | 12 | 24 |
| Plating Infiltration | 0/50 | 0/50 | 0/50 | 0/50 | 0/50 | 15/50 | 35/50 | 0/50 | 0/50 | 0/50 | 0/50 | 0/50 | 0/50 | 0/50 | 0/50 | 0/50 |
| Adh. bet. Subst. & Prepreg | 0/10 | 0/10 | 0/10 | 0/10 | 0/10 | 0/10 | 0/10 | 0/10 | 0/10 | 0/10 | 0/10 | 0/10 | 0/10 | 0/10 | 0/10 | 0/10 |
| Fluctuation in Plate Thick. (mm) | 0.08 | 0.08 | 0.08 | 0.08 | 0.08 | 0.08 | 0.08 | 0.08 | 0.18 | 0.10 | 0.06 | 0.04 | 0.08 | 0.08 | 0.08 | 0.08 |
| Moldability | G | G | G | G | G | G | G | G | G | G | G | N | G | G | G | G |
| Offset in Filler to Apert. | 0/10 | 0/10 | 0/10 | 0/10 | 0/10 | 0/10 | 0/10 | 0/10 | 0/10 | 0/10 | 0/10 | 0/10 | 4/10 | 0/10 | 0/10 | 5/10 |
| Fillability of Apert. Fill. Res. | G | G | G | G | G | G | G | G | G | G | G | G | G | G | G | G |

TABLE IIB

| | EX. 17 | 18 | 19 | 20 | 21 | 22 | 23 | 24 | 25 | 26 | 27 | 28 | 29 | Comp. Ex. |
|---|---|---|---|---|---|---|---|---|---|---|---|---|---|---|
| Condition: | | | | | | | | | | | | | | |
| Substrate | #1 | #1 | #1 | #1 | #1 | #1 | #1 | #1 | #1 | #1 | #1 | #1 | #1 | no treat. |
| Basic Mat. | #11 | #11 | #11 | #11 | #11 | #11 | #11 | #11 | #11 | #11 | #11 | #11 | #11 | woven fab. |
| Resin | #21 | #21 | #21 | #21 | #21 | #21 | #21 | #21 | #21 | #21 | #21 | #21 | #21 | #21 |
| Prepreg Melting Viscos. (Poise) | 600 | 600 | 600 | 600 | 600 | 600 | 600 | 600 | 600 | 600 | 600 | 600 | 600 | 600 |
| Filler to Perpreg (Spher.) | — | — | — | — | — | — | — | — | — | — | — | — | — | — |
| Filler to Prepreg (Needle) | #41 | #42 | #43 | #44 | #45 | #41 | #41 | #41 | #41 | #41 | #41 | #41 | #41 | — |
| Therm. Exp. Coeff. Diff. Bet. Subst. & Apert. Fill. Resin (ppm/°C.) | 7 | 7 | 7 | 7 | 7 | 20 | 25 | 7 | 7 | 7 | 7 | 7 | 7 | |
| Filler to Apert. Fill. Resin | #61 | #61 | #61 | #61 | #61 | #61 | #61 | #62 | #63 | #64 | #61 | #61 | #61 | — |
| Grain Size of Apert. Fill. Resin (μm) | 300 | 300 | 300 | 300 | 300 | 300 | 300 | 300 | 300 | 300 | 60 | 100 | 500 | — |
| Measurement: | | | | | | | | | | | | | | |
| Adh. of Thru. Hole Plat'g | 0/50 | 8/50 | 0/50 | 0/50 | 15/50 | 0/50 | 0/50 | 0/50 | 0/50 | 0/50 | 20/50 | 0/50 | 20/50 | 50/50 |
| Crack | 0/50 | 16/50 | 0/50 | 0/50 | 21/50 | 0/50 | 30/50 | 0/50 | 5/50 | 7/50 | 20/50 | 0/50 | 35/50 | 50/50 |
| Meezling | 0 | 0 | 0 | 0 | 0 | 0 | 0 | 0 | 0 | 0 | 0 | 0 | 0 | many |
| Surf. Uneven (μm) | 12 | 21 | 12 | 12 | 23 | 12 | 35 | 12 | 12 | 12 | 26 | 12 | 30 | 50 |
| Plating Infiltration | 0/50 | 0/50 | 0/50 | 0/50 | 0/50 | 0/50 | 0/50 | 0/50 | 0/50 | 0/50 | 0/50 | 0/50 | 0/50 | 35/50 |
| Adh. bet. Subst. & Prepreg | 0/10 | 0/10 | 0/10 | 0/10 | 0/10 | 0/10 | 0/10 | 0/10 | 0/10 | 0/10 | 0/10 | 0/10 | 0/10 | 10/10 |
| Fluctuation in Plate Thick. (mm) | 0.08 | 0.08 | 0.08 | 0.08 | 0.08 | 0.08 | 0.08 | 0.08 | 0.08 | 0.08 | 0.08 | 0.08 | 0.08 | 0.08 |
| Moldability | G | G | G | G | G | G | G | G | G | G | G | G | G | G |
| Offset in Filler to Apert. | 0/10 | 4/10 | 0/10 | 0/10 | 4/10 | 0/10 | 0/10 | 0/10 | 0/10 | 0/10 | 8/10 | 0/10 | 7/10 | 7/10 |
| Fillability of Apert. Fill. Res. | G | G | G | G | G | G | G | G | G | G | N | G | N | N |

What is claimed is:

1. A method for manufacturing a multilayer laminate, the method comprising the steps of stacking respectively alternately a plurality of substrates and a plurality of prepregs, each of said substrates comprising a copper plate of more than 0.15 mm thick and perforated to have apertures at portions corresponding to positions where through holes are to be formed, said perforated copper plates being preliminarily subjected to a surface roughening to be roughened at all surfaces including peripheral surfaces of said apertures with a synthetic resin containing a filler effective to minimize differences in thermal expansion coefficient of said filling resin and the copper substrate, and each of said prepregs comprising a non-woven fabric subjected to preliminary impregnating with a thermosetting synthetic resin including a filler for minimizing any fluctuation in the concentration between said filler-containing filling resin in the apertures and part of said prepreg-impregnating resin which flows into the apertures;
   molding said stack of said substrates and prepregs to be integral with each other; and
   forming said through holes of a diameter smaller than that of said apertures in said resin-filled apertures.

2. The method according to claim 1 wherein said filling said apertures is carried out with said synthetic resin which contains as said filler a needle-shape powder filler of center diameter more than 10 μm and as more than twice as long as said diameter.

3. The method according to claim 1 wherein said surface roughening is oxidizing of said surfaces of said copper plates.

4. The method according to claim 1 wherein said surface roughening is oxidizing and then reducing said copper plate surfaces.

5. The method according to claim 1 wherein said surface roughening is carrying out an electric plating.

6. The method according to claim 1 wherein said filling said apertures is carried out with said synthetic resin which contains as said filler a powder having center diameter of 100-350 μm.

7. The method according to claim 1 wherein said impregnation is carried out with respect to said nonwoven fabric which is of a glass.

8. The method according to claim 7 wherein said preliminary impregnating step comprises dipping a mat of integrated glass fibers in a binder solution for impregnating said mat with said solution, and drying said impregnated mat so that a content of said binder is less than 15 wt. % of the total amount of said glass fibers and binder.

9. The method according to claim 1 wherein said thermosetting resin is selected from the group consisting of an epoxy resin, polyimide resin and modified resins of said epoxy and polyimide resins.

10. The method according to claim 1 wherein said thermosetting resin has a glass transition temperature higher than 170° C.

11. The method according to claim 1 wherein said thermosetting resin has a melting viscosity of 70-2,000P at 130° C.

12. The method according to claim 1 further comprising said thermosetting with a filler which is spherical powder of center diameter less than 20 μm and blended at a load of 30-150PHR.

13. The method according to claim 1 wherein said filler is needle-shape powder of center diameter less than 15 μm and as more than twice as long as said diameter and blended at a load of 30-150PHR.

14. The method according to claim 1 wherein said filling said apertures is carried out with said synthetic resin mixed with said filler which is of a spherical powder of a center diameter more than 15 μm.

15. A method for manufacturing a multilayer laminate, the method comprising the steps of stacking respectively alternately a plurality of substrates each comprising a copper plate of more than 0.15 mm thick and perforated to have apertures at portions corresponding to positions where through holes are to be formed, subjecting said perforated copper plates to a surface roughening and filling said apertures with a synthetic resin having a difference in the thermal expansion coefficient from said copper plate by less than 20 ppm/°C. and containing a filler and a plurality of prepregs, each comprising a nonwoven fabric subjected to preliminary impregnating with a thermosetting synthetic resin including a filler; molding said stack of said substrates and prepregs to be integral with each other; and forming said through holes of a diameter smaller than that of said apertures in said rein-filled apertures.

* * * * *